United States Patent [19]
Chen

[11] Patent Number: 5,976,979
[45] Date of Patent: Nov. 2, 1999

[54] SEQUENTIAL OXYGEN PLASMA TREATMENT AND CHEMICAL MECHANICAL POLISH (CMP) PLANARIZING METHOD FOR FORMING PLANARIZED LOW DIELECTRIC CONSTANT DIELECTRIC LAYER

[75] Inventor: Lai-Juh Chen, Hsinchu, Taiwan

[73] Assignee: Industrial Technology Research Institute, Hsin-Chu, Taiwan

[21] Appl. No.: 08/872,580

[22] Filed: Jun. 10, 1997

[51] Int. Cl.[6] .................................................. H01L 21/3105
[52] U.S. Cl. .......................... 438/691; 438/692; 156/345
[58] Field of Search ................................... 438/691, 692, 438/693, 690; 156/345

[56] References Cited

U.S. PATENT DOCUMENTS

| | | | |
|---|---|---|---|
| 5,432,128 | 7/1995 | Tsu | 438/624 |
| 5,503,882 | 4/1996 | Dawson | 438/763 |
| 5,506,177 | 4/1996 | Kishimoto et al. | 438/624 |
| 5,532,191 | 7/1996 | Nakano et al. | 438/692 |
| 5,550,405 | 8/1996 | Cheung et al. | 257/642 |
| 5,645,736 | 7/1997 | Allman | 438/693 |
| 5,786,624 | 7/1998 | Havemann et al. | 257/635 |

*Primary Examiner*—William Powell
*Assistant Examiner*—Duy-Vu Deo
*Attorney, Agent, or Firm*—George O. Saile; Stephen B. Ackerman; Alek P. Szecsy

[57] ABSTRACT

A chemical mechanical polish (CMP) planarizing method for forming a planarized organo-functional siloxane polymer dielectric layer within a microelectronics fabrication. There is first provided a substrate employed within a microelectronics fabrication. There is then formed over the substrate an organo-functional siloxane polymer dielectric layer. The organo-functional siloxane polymer dielectric layer is then partially treated with an oxygen containing plasma to form from the organo-functional siloxane polymer dielectric layer an oxygen containing plasma treated organo-functional siloxane polymer dielectric upper layer and an organo-functional siloxane polymer dielectric lower residue layer. Finally, the oxygen containing plasma treated organo-functional siloxane polymer dielectric upper layer is planarized through a chemical mechanical polish (CMP) planarizing method to form a planarized oxygen containing plasma treated organo-functional siloxane polymer dielectric upper layer.

17 Claims, 8 Drawing Sheets

SEQUENTIAL OXYGEN PLASMA TREATMENT AND CHEMICAL MECHANICAL POLISH (CMP) PLANARIZING METHOD FOR FORMING PLANARIZED LOW DIELECTRIC CONSTANT DIELECTRIC LAYER

BACKGROUND OF THE INVENTION

1. Field of the Invention

The present invention relates generally to methods for forming dielectric layers within integrated circuits. More particularly, the present invention relates to methods for forming planarized low dielectric constant dielectric layers within integrated circuits.

2. Description of the Related Art

Integrated circuits are formed from semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by dielectric layers.

As integrated circuit device dimensions have decreased and integrated circuit device densities have increased, it has become increasingly important to form within advanced integrated circuits patterned interconnecting conductor layers which exhibit reduced delay times. Patterned interconnecting conductor layers which exhibit reduced delay times are desirable within advanced integrated circuits since reduced delay times within advanced integrated circuits typically provide: (1) apparent reductions in advanced integrated circuit operating speed; (2) deceases in patterned interconnecting conductor layer cross-talk; and (3) decreases in advanced integrated circuit power dissipation.

In order to reduce patterned interconnecting conductor layer delay time within advanced integrated circuits, it is known in the art of advanced integrated circuit fabrication to employ when forming inter-metal dielectric (IMD) layers between adjoining or successive patterned conductor layers within advanced integrated circuits dielectric materials which have a comparatively low dielectric constant. Within the general categories of dielectric materials which may be employed when forming inter-metal dielectric (IMD) layers within integrated circuits, organo-functional siloxane polymer dielectric materials are, in general, known to possess comparatively lower dielectric constants (ie: typically in the range of from about 1.8 to about 3.9) in comparison with purely inorganic dielectric materials such as silicon oxide dielectric materials, silicon nitride dielectric materials silicon oxynitride dielectric materials (ie: which typically have dielectric constants in the range of from about 2.8 to about 5.0). Such organo-functional siloxane polymer dielectric materials are known in the art of integrated circuit fabrication as a sub-group of gap-filling spin-on-glass (SOG) dielectric materials. They may be formed into inter-metal dielectric (IMD)) layers within advanced integrated circuits through spin-on-glass (SOG) coating and curing methods. In contrast, dielectric layers which are formed from purely inorganic dielectric materials are typically, although not exclusively, formed within advanced integrated circuits through activated deposition methods such as but not limited to thermal chemical vapor deposition (CVD) methods, plasma enhanced chemical vapor deposition (PECVD) methods and physical vapor deposition (PVD) sputtering methods.

Although organo-functional siloxane polymer dielectric materials are thus desirable as low dielectric constant dielectric materials when forming inter-metal dielectric (IMD) layers within advanced integrated circuits, organo-functional siloxane polymer dielectric materials are not entirely without problems in forming inter-metal dielectric (IMD) layers within advanced integrated circuits. In particular, it is known in the art of integrated circuit fabrication that intermetal dielectric (IMD) layers formed from organo-functional siloxane polymer dielectric materials are generally more difficult to reproducibly planarize through conventional chemical mechanical polish (CMP) planarizing methods than are otherwise equivalent inter-metal dielectric (IMD) layers formed from purely inorganic silicon oxide dielectric materials, silicon nitride dielectric materials or silicon oxynitride dielectric materials, since organo-functional siloxane polymer dielectric materials typically have relatively lower chemical mechanical polish (CMP) planarizing rates in comparison with purely inorganic silicon oxide dielectric materials, silicon nitride dielectric materials and silicon oxynitride dielectric materials. In addition, inter-metal dielectric (IMD) layers formed from organo-functional siloxane polymer dielectric materials when planarized through conventional chemical mechanical polish (CMP) planarizing methods typically also provide planarized organo-functional siloxane polymer inter-metal dielectric (IMD) layers with less uniformly planar surfaces than analogous inter-metal dielectric (IMD) layers formed from purely inorganic silicon oxide dielectric materials, silicon nitride dielectric materials and silicon oxynitride dielectric materials.

It is thus desirable within the art of microelectronics fabrication, such as but not limited to advanced integrated circuit microelectronics fabrication, to provide chemical mechanical polish (CMP) planarizing methods through which low dielectric constant organo-functional siloxane polymer dielectric materials may be formed and planarized to provide planarized organo-functional siloxane polymer dielectric layers, such as but not limited to planarized organo-functional siloxane polymer inter-metal dielectric (IMD) layers, with increased chemical mechanical polish (CMP) planarizing rates and with enhanced chemical mechanical polish (CMP) planarizing uniformity. It is towards these goals that the present invention is directed.

SUMMARY OF THE INVENTION

A first object of the present invention is to provide a chemical mechanical polish (CMP) planarizing method for forming a planarized organo-functional siloxane polymer dielectric layer within a microelectronics fabrication.

A second object of the present invention is to provide a method in accord with the first object of the present invention, where the planarized organo-functional siloxane polymer dielectric layer is formed with an increased chemical mechanical polish (CMP) planarizing rate in comparison with chemical mechanical polish (CMP) planarized organo-functional siloxane polymer dielectric layers as are conventional in the art of microelectronics fabrication.

A third object of the present invention is to provide a method in accord with the first object of the present invention, where the planarized organo-functional siloxane polymer dielectric layer is formed with an enhanced chemical mechanical polish (CMP) planarizing uniformity in comparison with chemical mechanical polish (CMP) planarized organo-functional siloxane polymer dielectric layers as are conventional in the art of microelectronics fabrication.

A fourth object of the present invention is to provide a method in accord with the first object of the present invention, the second object of the present invention or the third object of the present invention, where the microelectronics fabrication is an integrated circuit microelectronics fabrication.

A fifth object of the present invention is to provide a method in accord with the first object of the present invention, the second object of the present invention, the third object of the present invention or the fourth object of the present invention, which method is readily manufacturable.

In accord with the objects of the present invention, there is provided by the present invention a chemical mechanical polish (CMP) planarizing method for forming a planarized organo-functional siloxane polymer dielectric layer within a microelectronics fabrication. To practice the method of the present invention, there is first provided a substrate employed within a microelectronics fabrication. There is then formed over the substrate an organo-functional siloxane polymer dielectric layer. The organo-functional siloxane polymer dielectric layer is then treated partially with an oxygen containing plasma to form from the organo-functional siloxane polymer dielectric layer an oxygen containing plasma treated organo-functional siloxane polymer dielectric upper layer and an organo-functional siloxane polymer dielectric lower residue layer. The oxygen containing plasma treated organo-functional siloxane polymer dielectric upper layer is then planarized through a chemical mechanical polish (CMP) planarizing method to form a planarized oxygen containing plasma treated organo-functional siloxane polymer dielectric upper layer.

The present invention provides a chemical mechanical polish (CMP) planarizing method for forming a planarized organo-functional siloxane polymer dielectric layer within a microelectronics fabrication, where: (1) the planarized organo-functional siloxane polymer dielectric layer is formed with an increased chemical mechanical polish (CMP) planarizing rate in comparison with planarized organo-functional siloxane polymer dielectric layers as are conventional in the art of microelectronics circuit fabrication; and (2) the planarized organo-functional siloxane polymer dielectric layer is formed with an enhanced chemical mechanical polish (CMP) planarizing uniformity in comparison with planarized organo-functional siloxane polymer dielectric layers as are conventional in the art of microelectronics fabrication. The method of the present invention realizes the foregoing objects by forming through the method of the present invention from an organo-functional siloxane polymer dielectric layer an oxygen containing plasma treated organo-functional siloxane polymer dielectric upper layer which is subsequently planarized through an otherwise conventional chemical mechanical polish (CMP) planarizing method to form a planarized oxygen containing plasma treated organo-functional siloxane polymer dielectric upper layer. The oxygen containing plasma treated organo-functional siloxane polymer dielectric upper layer has an increased chemical mechanical polish (CMP) planarizing rate and an enhanced chemical mechanical polish (CMP) planarizing uniformity in comparison with the otherwise conventional organo-functional siloxane polymer dielectric layer from which it is formed.

The method of the present invention may be employed where the microelectronics fabrication is an integrated circuit microelectronics fabrication. The method of the present invention does not discriminate with respect to the nature of the microelectronics fabrication within which is formed a planarized organo-functional siloxane polymer dielectric layer through the method of the present invention. Thus, a planarized organo-functional siloxane polymer dielectric layer may be formed through the chemical mechanical polish (CMP) planarizing method of the present invention within microelectronics fabrications including but not limited to integrated circuit microelectronics fabrications, solar cell microelectronics fabrications, ceramic packaging microelectronics fabrications, other packaging microelectronics fabrications and flat panel display microelectronics fabrications.

The method of the present invention is readily manufacturable. The present invention provides a novel ordering of organo-functional siloxane polymer dielectric layer formation processes, oxygen containing plasma treatment processes and chemical mechanical polish (CMP) planarizing processes which are otherwise generally known in the art of microelectronics fabrication. Thus, the method of the present invention is readily manufacturable.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a chemical mechanical polish (CMP) planarizing method for forming a planarized organo-functional siloxane polymer dielectric layer within a microelectronics fabrication, where: (1) the planarized organo-functional siloxane polymer dielectric layer is formed with an increased chemical mechanical polish (CMP) planarizing rate in comparison with chemical mechanical polish (CMP) planarized organo-functional siloxane polymer dielectric layers as are conventional in the art of microelectronics fabrication; and (2) where the planarized organo-functional siloxane polymer dielectric layer is formed with an enhanced chemical mechanical polish (CMP) planarizing uniformity in comparison with chemical mechanical polish (CMP) planarized organo-functional siloxane polymer dielectric layers as are conventional in the art of microelectronics fabrication. The method of the present invention realizes the foregoing objects by forming through an oxygen containing plasma treatment of an organo-functional siloxane polymer dielectric layer an oxygen containing plasma treated organo-functional siloxane polymer dielectric upper layer and an organo-functional siloxane polymer dielectric lower residue layer. The oxygen containing plasma treated organo-functional siloxane polymer dielectric upper layer is subsequently planarized to form a planarized oxygen containing plasma treated organo-functional siloxane polymer dielectric upper layer through a chemical mechanical polish (CMP) planarizing method. The oxygen containing plasma treated organo-functional siloxane polymer dielectric upper layer has an increased chemical mechanical polish (CMP) planarizing rate and an enhanced chemical mechanical polish (CMP) planarizing uniformity in comparison with the organo-functional siloxane polymer dielectric layer from which it is formed. The chemical mechanical polish (CMP) planarized oxygen containing plasma treated organo-functional siloxane polymer dielectric upper layer and the organo-functional siloxane polymer dielectric lower residue layer form the planarized organo-functional siloxane polymer dielectric layer of the present invention.

Although the preferred embodiment of the method of the present invention illustrates the method of the present invention employed in forming within an integrated circuit microelectronics fabrication a pair of planarized organo-functional siloxane polymer inter-metal dielectric (IMD) layers, the method of the present invention may also be employed in: (1) forming planarized organo-functional siloxane polymer dielectric layers within locations other that intermetal dielectric (IMD) locations within integrated circuit microelectronics fabrications, where such other locations may include but are not limited to pre-metal dielectric (PMD) locations (prior to metal layer deposition within integrated circuits) and passivation locations (subsequent to metal deposition within integrated circuits); and (2) forming planarized organo-functional siloxane polymer dielectric layers within microelectronics fabrications other than integrated circuit microelectronics fabrications. Such other microelectronics fabrications may include, but are not limited to solar cell microelectronics fabrications, ceramic packaging microelectronics fabrications, other packaging microelectronics fabrications and flat panel display microelectronics fabrications. Such other microelectronics fabrications may also have formed therein as substrates microelectronic conductor structures, microelectronic semiconductor structures and microelectronic insulator structures.

Figure 1:
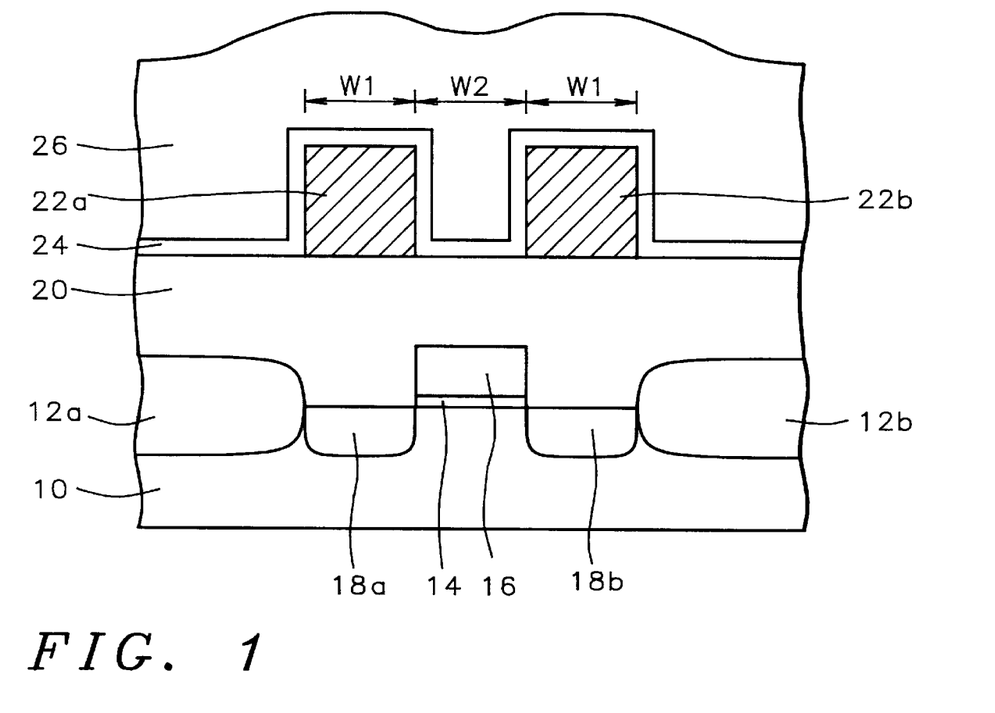
FIG. 1 to FIG. 6 show a series of schematic cross-sectional diagrams illustrating the results of progressive stages in forming within an integrated circuit microelectronics fabrication two planarized organo-functional siloxane polymer inter-metal dielectric (IMD) layers in accord with the preferred embodiment of the method of the present invention.

Referring now to FIG. 1 to FIG. 6, there is shown a series of schematic cross-sectional diagrams illustrating the results of progressive stages in forming within an integrated circuit microelectronics fabrication a pair of planarized organo-functional siloxane polymer inter metal dielectric (IMD) layers in accord with the preferred embodiment of the present invention. Shown in FIG. 1 is a schematic cross-sectional diagram of the integrated circuit microelectronics fabrication at an early stage in its fabrication.

Shown in FIG. 1 is a semiconductor substrate 10 having formed within and upon its surface a pair of isolation regions 12a and 12b which define an active region of the semiconductor substrate 10. Although it is known in the art of integrated circuit microelectronics fabrication that semiconductor substrates are available with either dopant polarity, various dopant concentrations and several crystallographic orientations, for the preferred embodiment of the present invention the semiconductor substrate 10 is preferably a (100) silicon semiconductor substrate having an N- or P-doping.

Similarly, although it is also known in the art of integrated circuit microelectronics fabrication that isolation regions may be formed within and/or upon semiconductor substrates through methods including but not limited to isolation region thermal growth methods and isolation region deposition/patterning methods, for the preferred embodiment of the present invention the isolation regions 12a and 12b are preferably formed within and upon the semiconductor substrate 10 through an isolation region thermal growth method at a temperature of from about 800 to about 1100 degrees centigrade to form isolation regions 12a and 12b of silicon oxide within and upon the semiconductor substrate 10.

Shown also within FIG. 1 formed within and upon the active region of the semiconductor substrate 10 is a field effect transistor (FET) which comprise a series of structures including: (1) a gate dielectric layer 14 formed upon the active region of the semiconductor substrate 10, the gate dielectric layer 14 having formed and aligned thereupon; (2) a gate electrode 16; and (3) a pair of source/drain regions 18a and 18b formed within the active region of the semiconductor substrate 10 at areas not occupied by the gate dielectric layer 14 and the gate electrode 16. Each of the structures within the series of structures which comprises the field effect transistor (FET) may be formed through methods and materials which are conventional in the art of field effect transistor (FET) fabrication.

For example, although it is known in the art of field effect transistor (FET) fabrication that gate dielectric layers may be formed through patterning, through methods as are conventional in the art, of blanket gate dielectric layers formed upon active regions of semiconductor substrates through methods including but not limited to blanket gate dielectric layer thermal growth methods and blanket gate dielectric layer deposition/patterning methods, for the preferred embodiment of the present invention the gate dielectric layer 14 is preferably formed through patterning, through methods as are conventional in the art, of a blanket gate dielectric layer formed through a blanket gate dielectric layer thermal growth method at a temperature of from about 800 to about 1200 degrees centigrade to form the blanket gate dielectric layer of silicon oxide of thickness about 50 to about 150 angstroms upon the active region of the semiconductor substrate 10.

Similarly, although it is also know in the art of field effect transistor (FET) fabrication that gate electrodes may be formed through patterning, through methods as are conventional in the art, of blanket gate electrode material layers formed of gate electrode materials including but not limited to metals, metal alloys, doped polysilicon or polycides (doped polysilicon/metal silicide stacks), for the preferred embodiment of the method of the present invention the gate electrode 16 is preferably formed through patterning, through methods as are conventional in the art, of a blanket layer of a doped polysilicon or polycide gate electrode material formed upon the blanket gate dielectric to a thickness of from about 1000 to about 5000 angstroms.

Finally, it is also known in the art of field effect transistor (FET) fabrication that source/drain regions are typically formed into active regions of semiconductor substrates through ion implantation methods employing dopant ions of polarity opposite the polarity of the semiconductor substrate within which is formed those source/drain regions. For the preferred embodiment of the present invention, the source/drain regions 18a and 18b are preferably formed within the active region of the semiconductor substrate 10 through a high dose ion implant at about 1E15 to about 9E15 dopant ions per square centimeter and about 20 to about 60 keV while employing the gate electrode 16 and the gate dielectric layer 14 as an ion implantation mask. The high dose ion implant is of polarity appropriate to the field effect transistor (FET) and the semiconductor substrate 10.

There is also shown within FIG. 1 formed upon the semiconductor substrate 10 and the series of structures which forms the field effect transistor (FET) a planarized pre-metal dielectric (PMD) layer 20. Methods and materials through which planarized pre-metal dielectric (PMD) layers may be formed within integrated circuits are known in the art of integrated circuit fabrication. Planarized pre-metal dielectric (PMD) layers may be formed within integrated circuits through methods including but not limited to chemical vapor deposition (CVD) methods, plasma enhanced chemical vapor deposition (PECVD) methods, physical vapor deposition (PVD) sputtering methods, along with reactive ion etch (RIE) etchback planarizing methods and chemical mechanical polish (CMP) planarizing methods, through which may be formed planarized pre-metal dielectric (PMD) layers of dielectric materials including but not limited to silicon oxide dielectric materials, silicon nitride dielectric materials and silicon oxynitride dielectric materials. For the preferred embodiment of the method of the present invention, the planarized pre-metal dielectric (PMD) layer 20 is preferably formed of a silicon oxide dielectric material deposited through a plasma enhanced chemical vapor deposition (PECVD) method and subsequently planarized through a chemical mechanical polish (CMP) planarizing method, as is common in the art of integrated circuit microelectronics fabrication, although other methods and materials may also be employed in forming the planarized pre-metal dielectric (PMD) layer 20. Preferably, the planarized pre-metal dielectric (PMD) layer 20 so formed is from about 3000 to about 10000 angstroms thick.

As is understood by a person skilled in the art, it is feasible to employ the method and materials of the present invention to form the planarized pre-metal dielectric layer 20 as a planarized organo-functional siloxane polymer pre-metal dielectric (PMD) layer rather than the planarized pre-metal dielectric (PMD) layer 20 formed from the preferred silicon oxide dielectric material deposited through the plasma enhanced chemical vapor deposition (PECVD) method. However, it is generally understood within the art of integrated circuit microelectronics fabrication that organo-functional siloxane polymer dielectric layers formed in the location of a pre-metal dielectric (PMD) layer are typically not preferred since it is typically necessary to form a via through the organo-functional siloxane polymer pre-metal dielectric (PMD) layer when reaching the source/drain region 18a or 18b. Such vias through organo-functional siloxane polymer pre-metal dielectric (PMD) layers are often typically susceptible to moisture sorbtion which generally facilitates oxidation and high resistance of conductor contact studs formed within those vias. Thus, although the present invention does not preclude forming a planarized organo-functional siloxane polymer pre-metal dielectric (PMD) layer as the planarized pre-metal dielectric (PMD) layer 20, such is not preferred.

There is also shown in FIG. 1 a pair of patterned first conductor layers 22a and 22b formed upon the planarized pre-metal dielectric (PMD) layer 20. Methods and materials through which patterned conductor layers may be formed within integrated circuits are known in the art of integrated circuit fabrication. Patterned conductor layers may be formed within integrated circuits through methods including but not limited to thermally assisted evaporation methods, electron beam assisted evaporation methods, chemical vapor deposition (CVD) methods and physical vapor deposition (PVD) sputtering methods, along with suitable photolithographic and etching methods, through which may be formed patterned conductor layers of conductor materials including but not limited metals, metal alloys, doped polysilicon and polycides. For the preferred embodiment of the present invention, the patterned first conductor layers 22a and 22b are preferably formed at least in part of an aluminum containing conductor material, as is common in the art of integrated circuit microelectronics fabrication. Preferably, each of the patterned first conductor layers 22a and 22b has a thickness upon the planarized pre-metal dielectric (PMD) layer of from about 2000 to about 9000 angstroms, while having a width W1 as defined in FIG. 1 of from about 2000 to about 8000 angstroms and a pitch W2 as similarly defined in FIG. 1 of from about 2000 to about 10000 angstroms.

Also shown in FIG. 1 formed upon the exposed portions of the planarized pre-metal dielectric (PMD) layer 20 and the patterned first conductor layers 22a and 22b is a first conformal inter-metal dielectric (IMD) layer 24. Methods and materials through which the first conformal inter-metal dielectric (IMD) layer 24 may be formed are known in the art of integrated circuit fabrication. Such methods and materials are preferably analogous or equivalent to the methods and materials through which is formed the conformal dielectric layer from which is formed the planarized pre-metal dielectric (PMD) layer 20. Analogously with the planarized pre-metal dielectric (PMD) layer 20, the first conformal inter-metal dielectric (IMD) layer 24 is preferably formed of a silicon oxide dielectric material formed through a plasma enhanced chemical vapor deposition (PECVD) method, although the first conformal inter-metal dielectric (IMD) layer 24 is not planarized. Preferably, the first conformal inter-metal dielectric (IMD) layer 24 is formed to a thickness of from about 100 to about 3000 angstroms.

Finally, there is shown in FIG. 1 the presence of a first gap filling organo-functional siloxane polymer inter-metal dielectric (IMD) layer 26 formed upon the first conformal inter-metal dielectric (IMD) layer 24. Methods and materials through which gap filling organo-functional siloxane polymer inter-metal dielectric (IMD) layers may be formed within integrated circuits are known in the art of integrated circuit fabrication. As discussed within the Background of the Invention, such gap filling organo-functional siloxane polymer inter-metal dielectric (IMD) layers are typically formed from spin-on-glass (SOG) organo-functional siloxane polymer dielectric materials through spin-on-glass (SOG) methods. Such organo-functional siloxane polymer dielectric materials typically and preferably have dielectric constants in the range of from about 1.8 to about 3.9, and such organo-functional siloxane polymer dielectric materials are also typically formed from condensation of alkyl substituted alkoxy silane starting materials, such as but not limited to methyl trimethoxy silane (CH3Si(OCH3)3), methyl triethoxy silane (CH3Si(OC2H5)3), ethyl trimethoxy silane (C2H5Si(OCH3)3), ethyl triethoxy silane (C2H5Si(OC2H5)3), and related higher order siloxane analogs. Typically and preferably, the first gap filling organo-functional siloxane polymer inter-metal dielectric (IMD) layer 26 is formed through coating and curing of an appropriate organo-functional siloxane dielectric material to a thickness of from about 2000 to about 10000 angstroms upon the first conformal inter-metal dielectric (IMD) layer 24.

Figure 2:
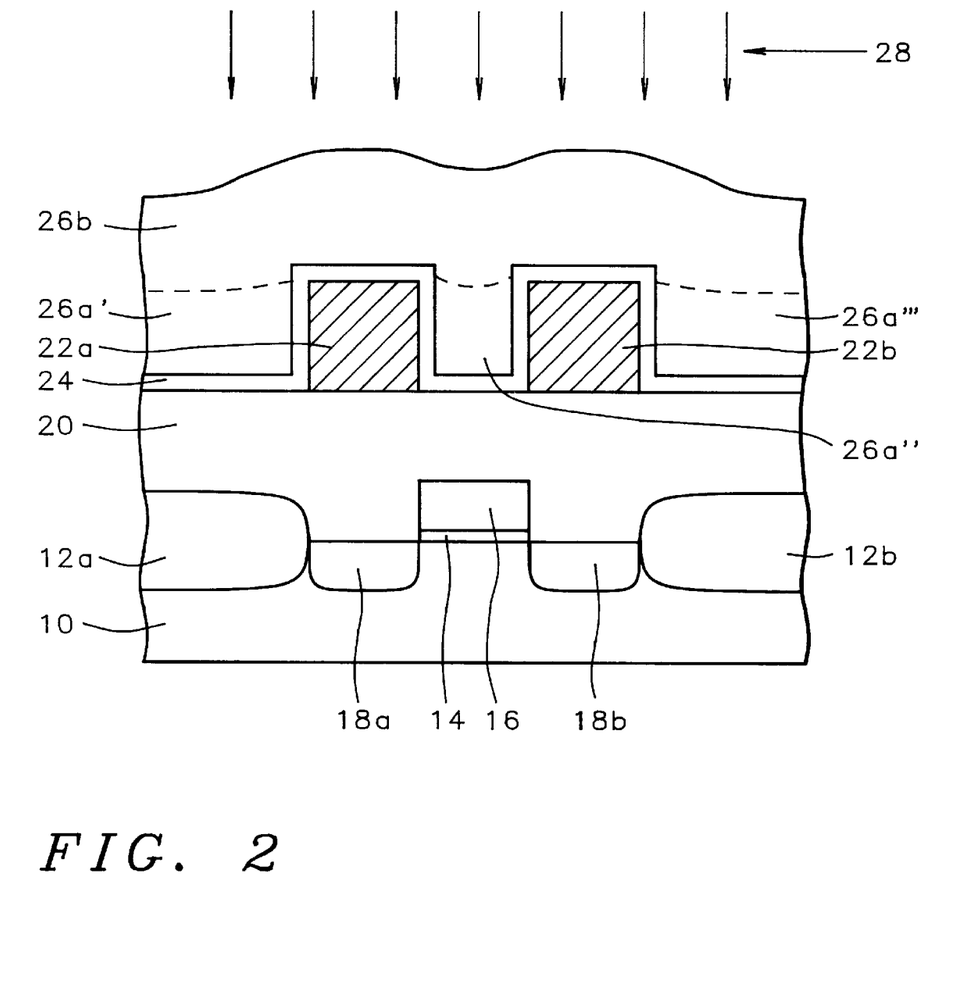

Referring now to FIG. 2, there is shown a schematic cross-sectional diagram of an integrated circuit microelectronics fabrication illustrating the results of further processing of the integrated circuit microelectronics fabrication whose schematic cross-sectional diagram is illustrated in FIG. 1. Shown in FIG. 2 is an schematic cross-sectional diagram of an integrated circuit microelectronics fabrication otherwise equivalent to the integrated circuit microelectronics fabrication whose schematic cross-sectional diagram is illustrated in FIG. 1, but wherein the first gap filling organo-functional siloxane polymer inter-metal dielectric (IMD) layer 26 has been treated with an oxygen containing plasma 28 to form the oxygen containing plasma treated first gap filling organo-functional siloxane polymer inter-metal dielectric (IMD) upper layer 26b and the series of first gap filling organo-functional siloxane polymer inter-metal dielectric (IMD) lower residue layers 26a', 26a" and 26a'".

When forming from the integrated circuit microelectronics fabrication whose schematic cross-sectional diagram is illustrated in FIG. 1 the integrated circuit microelectronics fabrication whose schematic cross-sectional diagram is illustrated in FIG. 2, it is typically the power and treatment time of the first gap filling organo-functional siloxane polymer inter-metal dielectric (IMD) layer 26 with the first oxygen containing plasma 28 that largely controls the depth to which the oxygen containing plasma treated first gap filling organo-functional siloxane polymer inter-metal dielectric (IMD) upper layer 26b is formed with respect to the series of first gap filling organo-functional siloxane polymer inter-metallic dielectric (IMD) lower residue layers 26a', 26a" and 26a'". As is illustrated in FIG. 1 the depth of the oxygen containing plasma treated gap filling organo-functional siloxane inter-metal dielectric (IMD) upper layer 26b preferably extends below the upper reach of the first conformal inter-metal dielectric (IMD) layer 24 and the patterned first conductor layers 22a and 22b. While this location for the interface of the oxygen containing plasma treated first gap filling organo-functional siloxane polymer intermetal dielectric (IMD) upper layer 26b with respect to the first gap filling organo-functional siloxane polymer inter-metal dielectric (IMD) lower residue layers 26a', 26a" and 26a'" is preferred within the preferred embodiment of the present invention, the location of the interface may be either higher or lower within alternative microelectronics fabrications while still providing an embodiment which is within the present invention.

Within the context of the preferred embodiment of the present invention, the thickness of the oxygen containing plasma treated first gap filling organo-functional siloxane polymer inter-metal dielectric (IMD) upper layer 26b is preferably from about 1000 to about 9000 angstroms while the thickness of each layer within the series of first gap filling organo-functional siloxane polymer inter-metal dielectric (IMD) lower residue layers 26a', 26a" and 26a'" is also typically and preferably from about 1000 to about 9000 angstroms, thus providing the series of first gap filling organo-functional siloxane polymer inter-metal dielectric (IMD) lower residue layers 26a', 26a" and 26a'" which substantially fill the apertures adjoining the patterned first conductor layers 22a and 22b.

Within the preferred embodiment of the present invention, the first oxygen containing plasma 28 may include oxygen containing species chosen from the group of oxygen containing species consisting of oxygen, ozone, nitrous oxide and nitric oxide, along with optional added non-reactive diluent gases such as but not limited to helium and argon. Preferably, the first oxygen containing plasma 28 comprises oxygen. More preferably, the first oxygen containing plasma 28 also employs: (1) a reactor chamber pressure of from about 10 to about 100 mtorr; (2) a radio frequency power of from about 100 to about 3000 watts at a radio frequency of 13.56 MHZ; (3) a semiconductor substrate 10 temperature of from about 20 to about 400 degrees centigrade; (4) an oxygen flow rate of from about 10 to about 300 standard cubic centimeters per minute (sccm); and (5) an exposure time of from about 10 to about 600 seconds.

As is seen within the examples which follow, through the first oxygen containing plasma 28 treatment, the oxygen containing plasma treated first gap filling organo-functional siloxane inter-metal dielectric (IMD) upper layer 26b has reduced siliconon bonding content in comparison with the first gap filling organo-functional siloxane polymer inter-metal dielectric layer 26.

Figure 3:
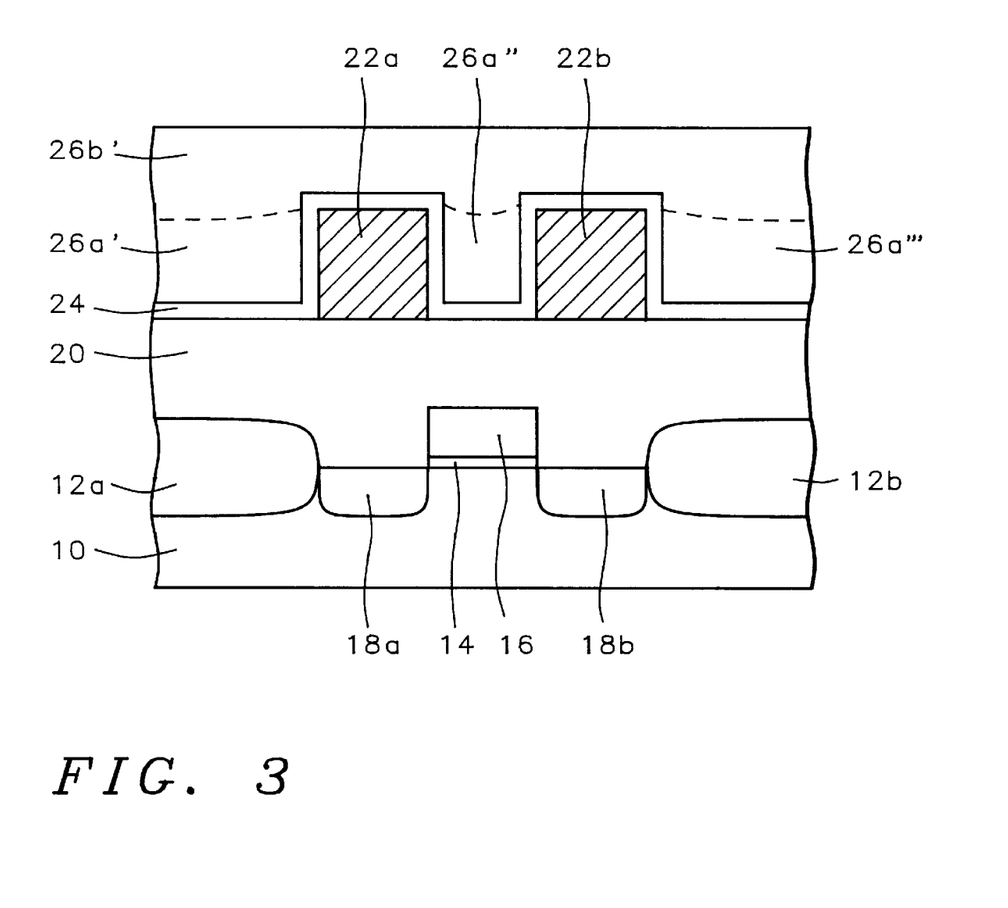

Referring now to FIG. 3, there is shown a schematic cross-sectional diagram illustrating the results of further processing of the integrated circuit microelectronics fabrication whose schematic cross-sectional diagram is illustrated in FIG. 2. Shown in FIG. 3 is a schematic cross-sectional diagram of an integrated circuit microelectronics fabrication otherwise equivalent to the integrated circuit microelectronics fabrication whose schematic cross-sectional diagram is illustrated in FIG. 2, but wherein the oxygen containing plasma treated first gap filling organo-functional siloxane polymer inter-metal dielectric (IMD) upper layer 26b has been planarized to form the planarized oxygen containing plasma treated first gap filling organo-functional siloxane polymer inter-metal dielectric (IMD) upper layer 26b'.

Within the method of the present invention, the oxygen containing plasma treated first gap filling organo-functional siloxane polymer inter-metal dielectric (IMD) upper layer 26b is planarized to form the planarized oxygen containing plasma treated first gap filling organo-functional siloxane polymer inter-metal dielectric (IMD) upper layer 26b' through a chemical mechanical polish (CMP) planarizing method as is otherwise conventional in the art of integrated circuit microelectronics fabrication. Preferably, the chemical mechanical polish (CMP) planarizing method employs: (1) a platen pressure of from about 2 to about 12 pounds per square inch (psi) and a backside pressure of from about 2 to about 12 pounds per square inch (psi); (2) a platen rotation speed of from about 10 to about 100 revolutions per minute (rpm); (3) a polishing pad counter-rotation speed of from about 10 to about 100 revolutions per minute (rpm); (4) an aqueous silica slurry at a concentration of from about 5 to about 25 weight percent silica and at a flow rate of from about 50 to about 200 cubic centimeters per minute (ccm); and (5) a semiconductor substrate 10 temperature of from about 5 to about 30 degrees centigrade. Preferably, the planarized oxygen containing plasma treated first gap filling organo-functional siloxane polymer inter-metal dielectric (IMD) upper layer 26b' is formed through chemical mechanical polish (CMP) planarizing removal of from about 1000 to about 9000 angstroms from the oxygen containing plasma treated first gap filling organo-functional siloxane polymer intermetal dielectric (IMD) upper layer 26b.

Figure 4:
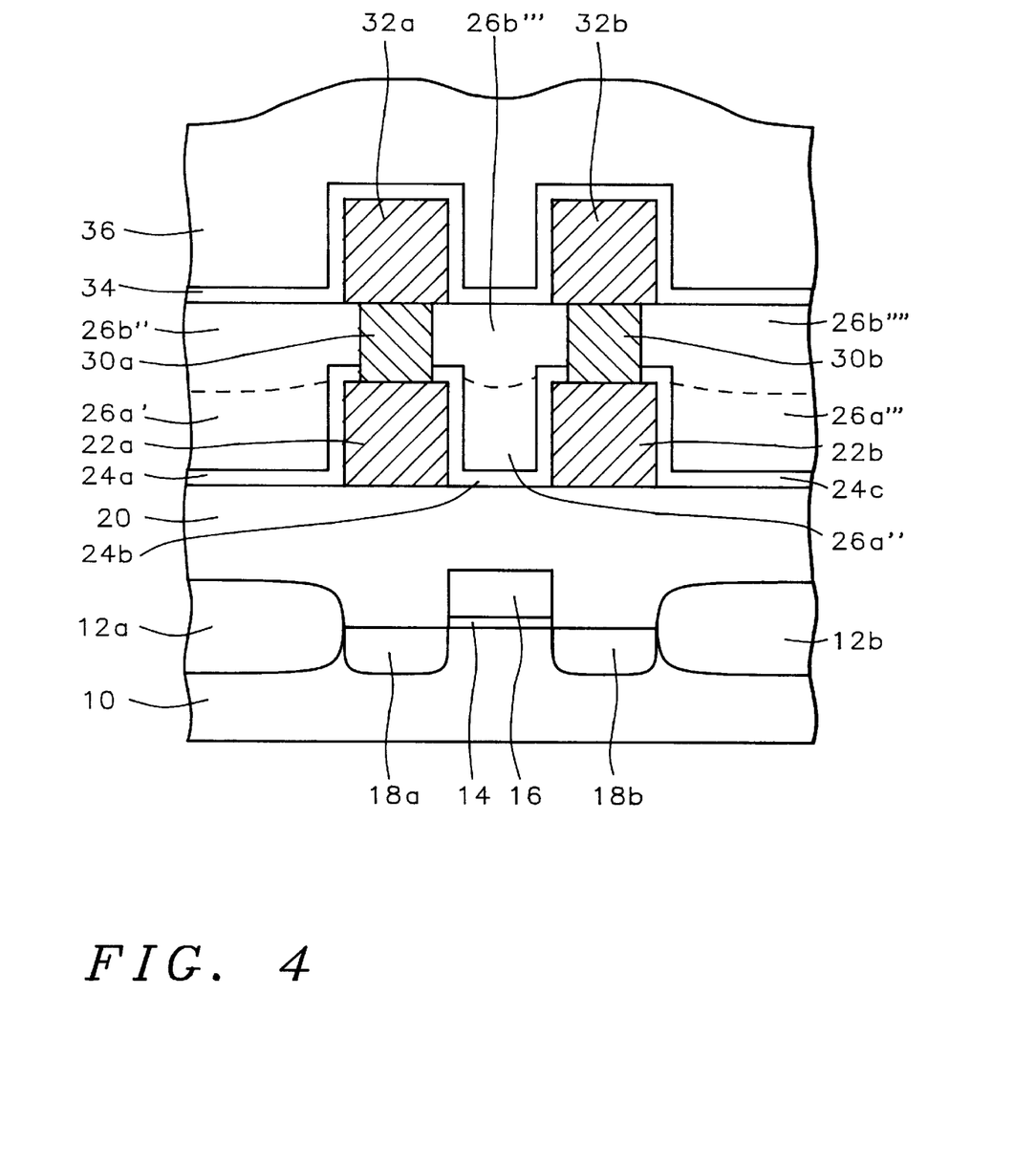

Referring now to FIG. 4, there is shown a schematic cross-sectional diagram illustrating the results of further processing of the integrated circuit microelectronics fabrication whose schematic cross-sectional diagram is illustrated in FIG. 3. Shown within FIG. 4 is a schematic cross-sectional diagram of an integrated circuit microelectronics fabrication otherwise equivalent to the integrated circuit microelectronics fabrication whose schematic cross-sectional diagram is illustrated in FIG. 3, but wherein there is formed through the planarized oxygen containing plasma treated first gap filling organo-functional siloxane polymer inter-metal dielectric (IMD) upper layer 26b' and the first conformal inter-metal dielectric (IMD) layer 24 a pair of vias accessing the patterned first conductor layers 22a and 22b, while simultaneously forming a series of patterned first conformal inter-metal dielectric layers 24a, 24b and 24c, and a series of patterned planarized oxygen containing plasma treated first gap filling organo-functional siloxane polymer inter-metal dielectric (IMD) upper layers 26b", 26b'" and 26b'". The pair of vias so formed accessing the patterned first conductor layers 22a and 22b is typically and preferably formed through reactive ion etch (RIE) plasma etch methods as are conventional in the art of integrated circuit microelectronics fabrication.

Also shown within FIG. 4 formed within the pair of vias defined by the patterned planarized oxygen containing plasma treated first gap filling organo-functional siloxane inter-metal dielectric upper layers 26b", 26b'" and 26b"" and the patterned first conformal inter-metal dielectric (IMD) layers 24a, 24b and 24c is a pair of conductive interconnection studs 30a and 30b. Methods and materials through which conductive interconnection studs may be formed within integrated circuits are known in the art of integrated circuit fabrication. Conductive interconnection studs may be formed within integrated circuits through methods including but not limited to thermally assisted evaporation methods, electron beam assisted evaporation methods, chemical vapor deposition (CVD) methods and physical vapor deposition (PVD) sputtering methods through which may be formed conductive interconnection studs of conductive materials including but not limited to metals, metal alloys, doped polysilicon and polycides. For the preferred embodiment of the method of the present invention, the conductive interconnection studs 30a and 30b are each preferably formed at least in part of a tungsten material deposited through a chemical vapor deposition method, as is common in the art of integrated circuit microelectronics fabrication. Preferably, the conductive interconnection studs 30a and 30b are each formed to a thickness sufficient to reach the upper surfaces of the series of patterned planarized oxygen containing plasma treated first gap filling organo-functional siloxane polymer inter-metal dielectric (IMD) upper layers 26b", 26b'" and 26b"".

Finally, there is shown in FIG. 4 the presence of: (1) a pair of patterned second conductor layers 32a and 32b formed upon the series of patterned planarized oxygen plasma treated first gap filling organo-functional siloxane polymer inter-metal dielectric (IMD) upper layers 26b", 26b'" and 26b"" and making contact, respectively, with the pair of conductive interconnection studs 30a and 30b; (2) a second conformal inter-metal dielectric (IMD) layer 34 formed upon exposed portions of the patterned second conductor layers 32a and 32b and the patterned planarized oxygen plasma treated first gap-filling organo-functional siloxane polymer inter-metal dielectric upper layers 26b", 26b'" and 26b""; and (3) a second gap filling organo-functional siloxane polymer inter-metal dielectric (IMD) layer 36 formed upon the second conformal inter-metal dielectric (IMD) layer 34.

Within the preferred embodiment of the present invention, the patterned second conductor layers 32a and 32b are preferably formed through methods and materials, and with dimensions, analogous or equivalent to the methods, materials and dimensions employed in forming the patterned first conductor layers 22a and 22b. Similarly, within the preferred embodiment of the present invention, the second conformal inter-metal dielectric (IMD) layer 34 is preferably formed through methods and materials, and with dimensions, analogous or equivalent to the methods, materials and dimensions employed in forming the first conformal inter-metal dielectric (IMD) layer 24. Finally, within the preferred embodiment of the present invention, the second gap filling organo-functional siloxane polymer inter-metal dielectric (IMD) layer 36 is preferably formed through methods and materials, and with dimensions, analogous or equivalent to the methods, materials and dimensions employed in forming the first gap filling organo-functional siloxane polymer inter-metal dielectric (IMD) layer 26.

Figure 5:
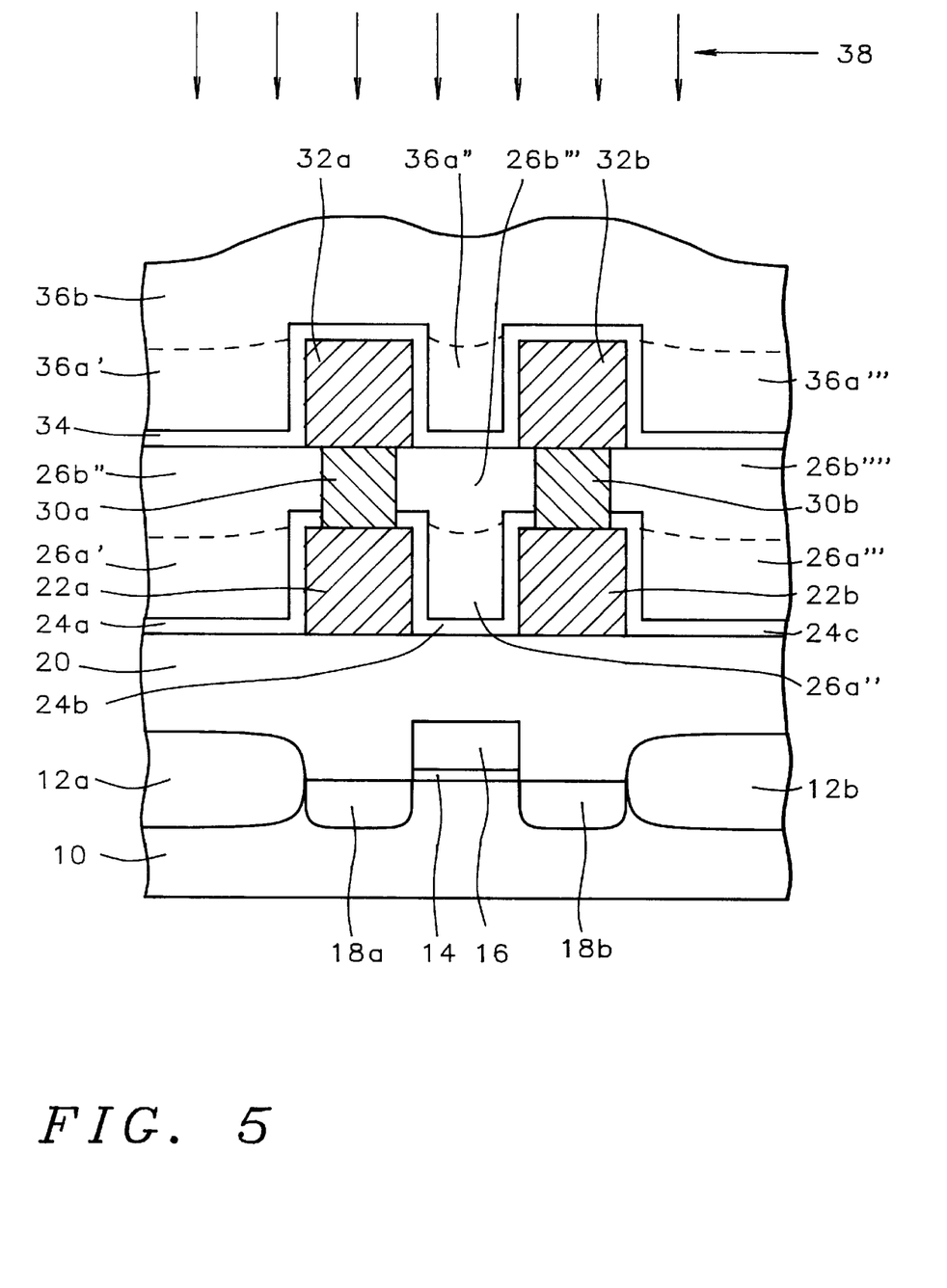

Referring now to FIG. 5, there is shown a schematic cross-sectional diagram illustrating the results of further processing of the integrated circuit nicroelectronics fabrication whose schematic cross-sectional diagram is illustrated in FIG. 4. Shown in FIG. 5 is a schematic cross-sectional diagram of an integrated circuit microelectronics fabrication otherwise equivalent to the integrated circuit microelectronics fabrication whose schematic cross-sectional diagram is illustrated in FIG. 4, but wherein the second gap filling organo-functional siloxane polymer intermetal dielectric (IMD) layer 36 has been treated with a second oxygen containing plasma 38 to form an oxygen plasma treated second gap filling organo-functional siloxane polymer inter-metal dielectric (IMD) upper layer 36b and a series of second gap filling organo-functional siloxane polymer inter-metal dielectric (IMD) lower residue layers 36a', 36a" and 36a'".

Within the preferred embodiment of the present invention, the first oxygen containing plasma 38 is preferably employed within process conditions and parameters analogous or equivalent to the process conditions and parameters employed in forming the first oxygen containing plasma 28. Thus, the oxygen containing plasma treated second gap filling organo-functional siloxane polymer inter-metal dielectric (IMD) upper layer 36b is formed with analogous or equivalent properties to the properties formed within the oxygen containing plasma treated first gap filling organo-functional siloxane polymer inter-metal dielectric (IMD) upper layer 26b.

Figure 6:
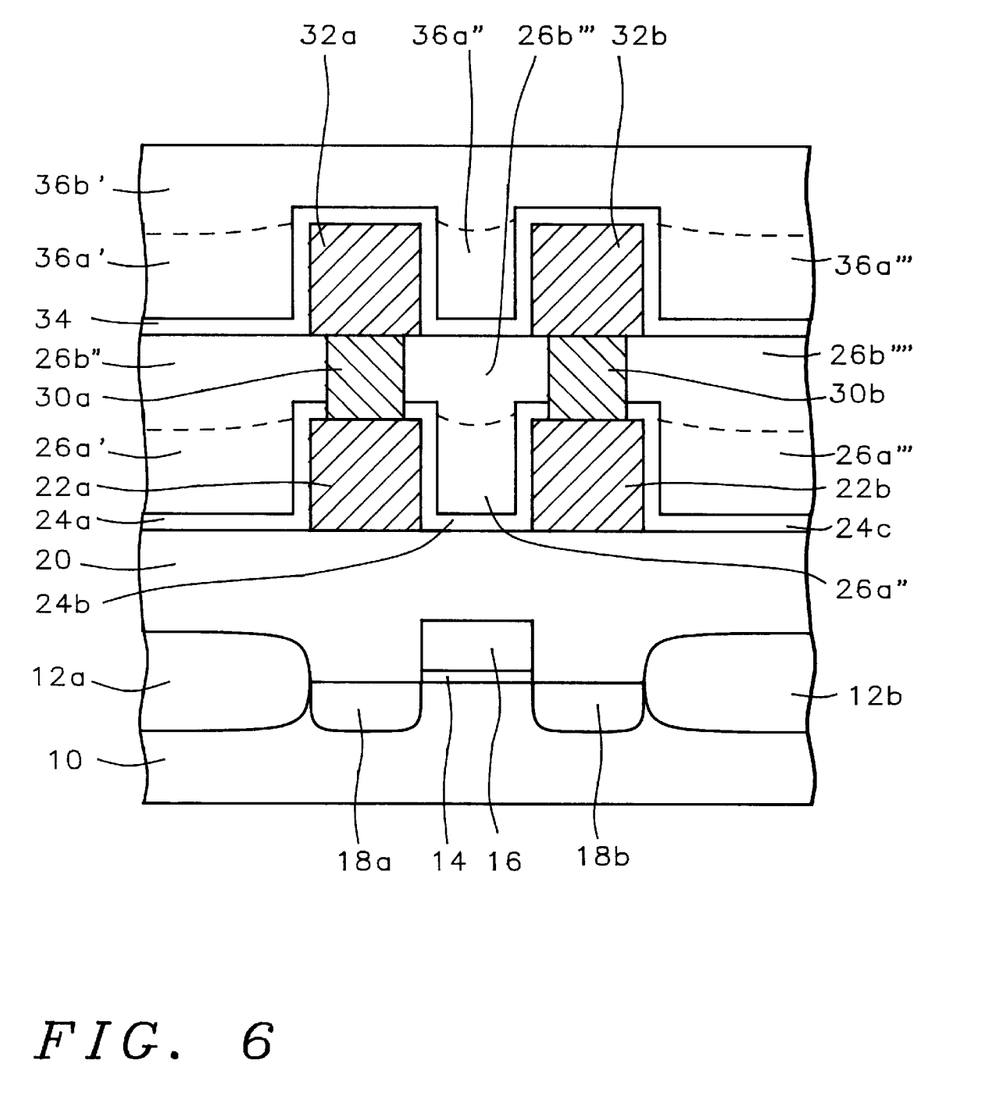

Referring now to FIG. 6, there is shown a schematic cross-sectional diagram illustrating the results of further processing of the integrated circuit microelectronics fabrication whose schematic cross-sectional diagram is illustrated in FIG. 5. Shown in FIG. 6 is a schematic cross-sectional diagram of an integrated circuit microelectronics fabrication otherwise equivalent to the integrated circuit microelectronics fabrication whose schematic cross-sectional diagram is illustrated in FIG. 5, but wherein the oxygen containing plasma treated second gap filling organo-functional siloxane polymer inter-metal dielectric (IMD) upper layer 36b has been planarized to form a planarized oxygen containing plasma treated second gap filling organo-functional siloxane polymer inter-metal dielectric (1) upper layer 36b'. Within the preferred embodiment of the present invention, the oxygen containing plasma treated second gap filling organo-functional siloxane polymer inter-metal dielectric (IMD) upper layer 36b is planarized to form the planarized oxygen containing plasma treated organo-functional siloxane polymer inter-metal dielectric (IMD) upper layer 36b' through a chemical mechanical polish (CMP) planarizing method analogous or equivalent to the chemical mechanical polish (CMP) planarizing method through which the oxygen containing plasma treated first gap filling organo-functional siloxane polymer inter-metal dielectric (IMD) upper layer 26b is chemical mechanical polish (CMP) planarized to form the planarized oxygen containing plasma treated first gap filling organo-functional siloxane polymer inter-metal dielectric (IMD) upper layer 26b'.

Upon forming the integrated circuit microelectronics fabrication whose schematic cross sectional diagram is illustrated in FIG. 6, there is formed an integrated circuit microelectronics fabrication having formed therein two chemical mechanical polish (CMP) planarized inter-metal dielectric (IMD) layers which provide a low dielectric constant dielectric material interposed between two pair of patterned conductor layers while simultaneously providing: (1) an increased chemical mechanical polish (CMP) polishing rate in comparison with the chemical mechanical polish (CMP) polishing rate of a layer from which is formed the low dielectric constant dielectric material; and (2) an increased chemical mechanical polish (CMP) planarizing uniformity in comparison with the chemical mechanical polish (CMP) planarizing uniformity of a layer from which is formed the low dielectric constant dielectric material.

As is understood by a person skilled in the art, although the preferred embodiment of the present invention discloses a method for forming two chemical mechanical polish (CMP) planarized inter-metal dielectric (IMD) layers, the upper of the two chemical mechanical polish (CMP) planarized inter-metal dielectric (IMD) layers may also represent a passivation dielectric layer (ie: post metal dielectric layer) under circumstances where there is formed thereupon no additional interconnecting metallization within the integrated circuit microelectronics fabrication within which is formed the chemical mechanical polish (CMP) planarized inter-metal dielectric (IMD) layers.

EXAMPLES

Upon the surface of each semiconductor substrate within a first group of semiconductor substrates was coated a first organo-functional methylsilsesquioxane siloxane polymer dielectric material available as Allied-Signal 418 organo-functional siloxane polymer dielectric material from Allied-Signal Inc., 3500 Garrett Drive, Santa Clara, Calif. Similarly upon the surface of each semiconductor substrate within a second group of semiconductor substrates was coated a second organo-functional methylsilsesquioxane siloxane polymer dielectric material available as Allied-Signal X11 organo-functional siloxane polymer dielectric material from Allied-Signal Inc. The first organo-functional siloxane polymer dielectric material differed from the second organo-functional siloxane polymer dielectric material primarily in the percentage silicon-carbon bonded organic material content within the organo-functional siloxane dielectric materials. Coating thicknesses of the first organo-functional siloxane polymer dielectric material upon the first group of semiconductor substrates and the second organo-functional siloxane polymer dielectric material upon the second group of semiconductor substrates ranged from about 1000 to about 9000 angstroms after spin coating and curing at a temperature of about 350 degrees centigrade for a time period of about 450 minutes.

Several of each of the first organo-functional siloxane polymer dielectric layers and the second organo-functional siloxane polymer dielectric layers were then exposed to an oxygen plasma treatment at: (1) a reactor chamber pressure of about 40 mtorr; (2) a varied radio frequency power at a radio frequency of 13.56 MHZ; (3) a semiconductor substrate temperature of about 25 degrees centigrade; (4) an oxygen flow rate of about 30 standard cubic centimeters per minute (sccm); and (5) a varied time period, to form oxygen plasma treated organo-functional siloxane polymer dielectric layers. The organo-functional siloxane polymer dielectric layers or the oxygen plasma treated organo-functional siloxane polymer dielectric layers were then analyzed through fourier transform infrared (FTIR) spectroscopy or secondary ion mass spectroscopy (SIMS) techniques to allow for their characterization.

Figure 7:
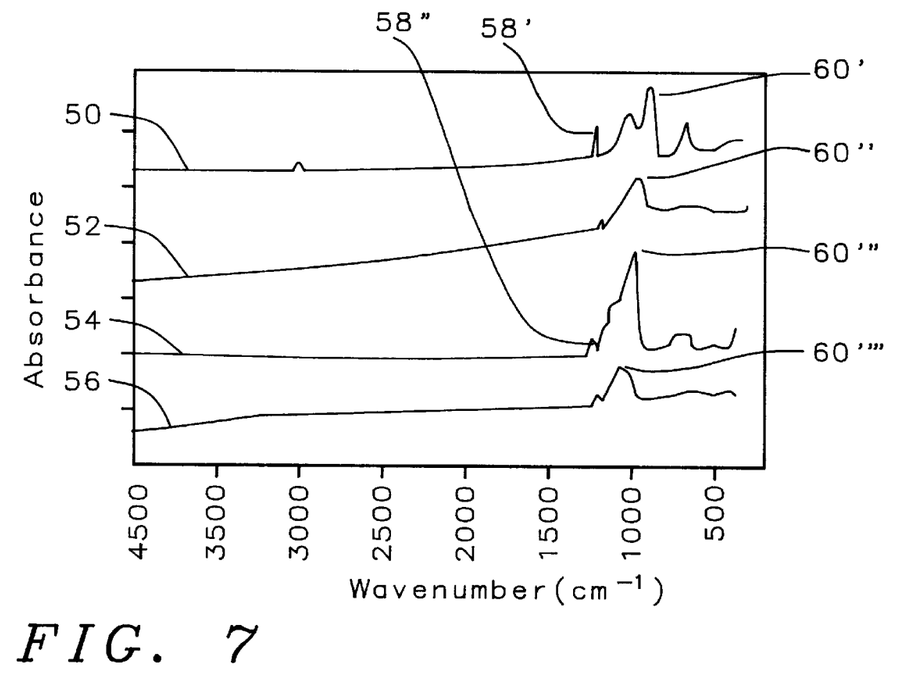
FIG. 7 shows a series of fourier transform infrared (FTIR) spectra of organo-functional siloxane polymer dielectric layers and corresponding oxygen containing plasma treated organo-functional siloxane polymer dielectric layers formed in accord with the examples of the present invention.

Shown in FIG. 7 is a series of fourier transform infrared (FTIR) spectra obtained for both a first organo-functional siloxane polymer dielectric layer and a second organo-functional siloxane polymer dielectric layer both with and without the oxygen plasma treatment. Organo-functional siloxane polymer dielectric layers thicknesses were about 4000 angstroms. Oxygen plasma treatments were undertaken at a radio frequency power of about 300 watts for a time period of about 10 minutes. Within FIG. 7, curve 50 corresponds with a second organo-functional siloxane polymer dielectric layer without oxygen plasma treatment. In addition, curve 52 corresponds with an oxygen plasma treated second organo-functional siloxane polymer dielectric layer. Similarly, curve 54 corresponds with a first organo-functional siloxane polymer dielectric layer without oxygen plasma treatment. Finally, curve 56 corresponds with an oxygen plasma treated first organo-functional siloxane polymer dielectric layer. Noticeable within curve 50 and curve 54 are a pair of peaks 58' and 58" at about 1275 wavenumbers which correspond with a silicon-carbon (ie: Si—C) vibrational mode. Peaks corresponding with the pair of peaks 58' and 58" are noticeably absent within curves 52 and 56, thus indicating loss of silicon-carbon bonded organic functionality within the oxygen plasma treated organo-functional siloxane polymer dielectric layers. The peaks 60', 60", 60'" and 60"" at about 1050 to about 1150 wavenumbers correspond with silicon-oxygen-silicon (ie: Si—O—Si) vibrational modes within all layers.

Figure 8:
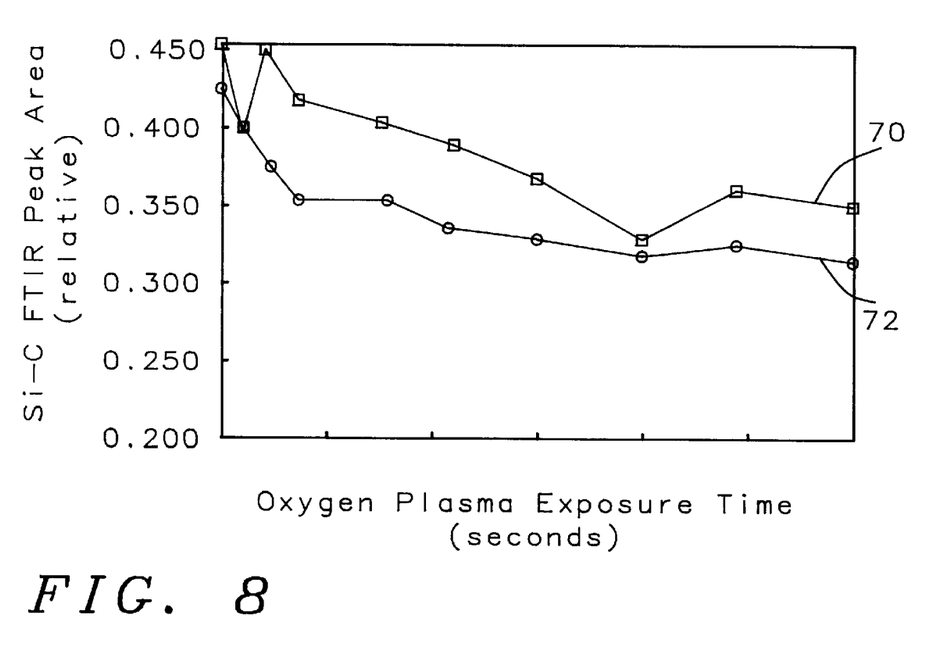
FIG. 8 shows a plot of Si—C FTIR Peak Area versus Oxygen Plasma Exposure Time at multiple radio frequency plasma powers for oxygen containing plasma treated organo-functional siloxane polymer dielectric layers formed in accord with the examples of the present invention.

Correlating with FIG. 7, there is shown in FIG. 8 a plot of silicon-carbon normalized fourier transform infrared spectrum vibrational peak height as a function of oxygen plasma treatment time for oxygen plasma treatment of a series of first organo-functional siloxane polymer dielectric layers. Within FIG. 8, the curve corresponding with reference numeral 70 corresponds with an oxygen plasma radio frequency power of 100 watts, while the curve corresponding with reference numeral 72 corresponds with an oxygen plasma radio frequency power of 300 watts. As is seen within FIG. 8, the silicon-carbon normalized fourier transform infrared spectrum vibrational peak height generally decreases with increased oxygen plasma exposure time or increased oxygen plasma radio frequency power.

Figure 9:
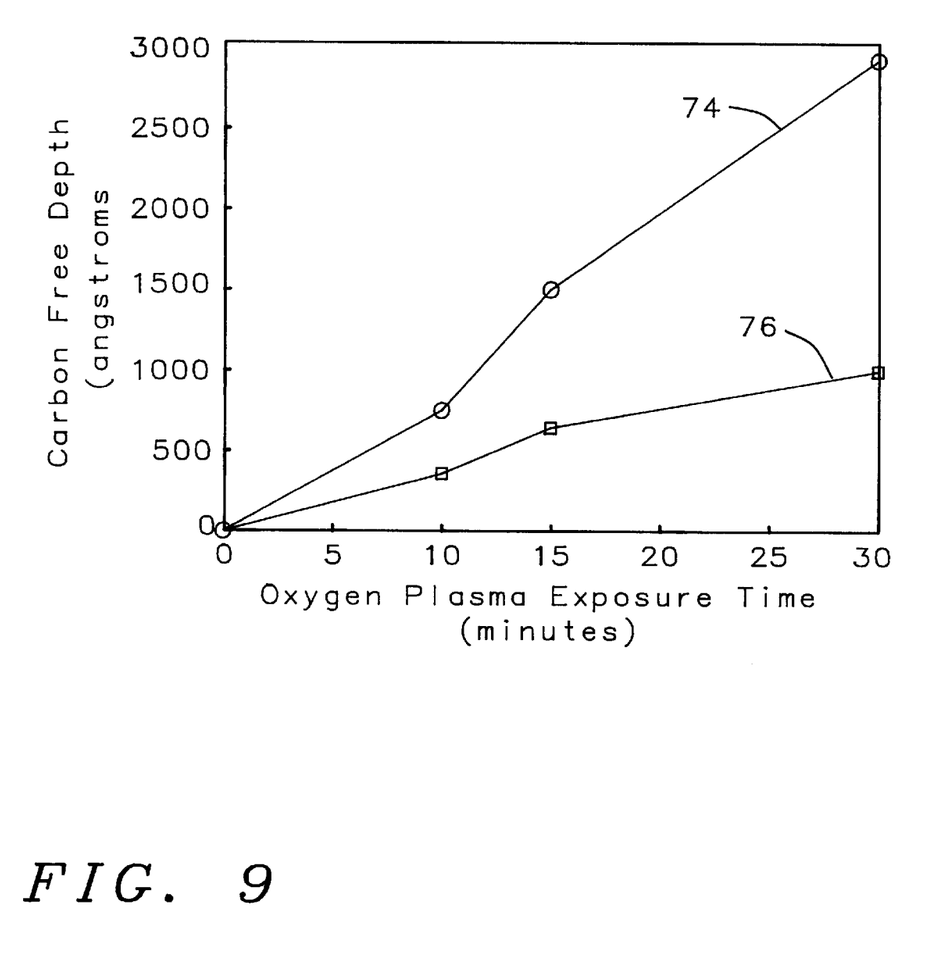
FIG. 9 shows a plot of Carbon Free Depth versus Oxygen Plasma Exposure Time at multiple radio frequency plasma powers for oxygen containing plasma treated organo-functional siloxane polymer dielectric layers formed in accord with the examples of the present invention.

Shown in FIG. 9 is a graph of carbon depletion depth within an oxygen plasma treated first organo-functional siloxane polymer dielectric layer as a function of oxygen plasma exposure time. The carbon depletion depth was determined through a secondary ion mass spectroscopy (SIMS) analysis. Within FIG. 9, curve 74 corresponds with an oxygen plasma radio frequency power of 300 watts, while curve 76 corresponds with an oxygen plasma radio frequency power of 100 watts. An is seen within FIG. 9, the carbon depletion depth within an oxygen plasma treated first organo-functional siloxane polymer dielectric layer increases as a function of either oxygen plasma exposure time or oxygen plasma radio frequency power.

Finally, in order to determine the physical properties of organo-functional siloxane polymer dielectric layers with and without oxygen plasma treatment there was chemical mechanical polish (CMP) planarized several samples each of: (1) a first organo-functional siloxane polymer dielectric layer; (2) an oxygen plasma treated first organo-functional siloxane polymer dielectric layer; (3) a second organo-functional siloxane polymer dielectric layer; and (4) an oxygen plasma treated second organo-functional siloxane polymer dielectric layer, while employing a chemical mechanical polish (CMP) planarizing method otherwise conventional in the art of integrated circuit microelectronics fabrication. The chemical mechanical polish (CMP) planarizing method employed: (1) a platen pressure of about 7 pounds per square inch (psi) and a backside pressure of about 5 pounds per square inch (psi); (2) a platen rotation speed of about 50 revolutions per minute (rpm); (3) a polishing pad counter-rotation speed of about 50 revolutions per minute (rpm); (4) an aqueous silica slurry at a concentration of about 10 weight percent silica and at a flow rate of about 200 cubic centimeters per minute (ccm); and (5) a semiconductor substrate temperature of about 25 degrees centigrade.

There was then determined a chemical mechanical polish (CMP) planarizing rate for each of the foregoing samples of organo-functional siloxane polymer dielectric layers through ellipsometric methods as are conventional in the art or integrated circuit fabrication. In addition, there was also determined a chemical mechanical polish (CMP) planarizing uniformity for each of the foregoing samples of organo-functional siloxane polymer dielectric layers through a standard calculation method (ie: uniformity=(maximum layer thickness−minimum layer thickness)/average layer thickness; and percent uniformity=100 (uniformity)). The calculated chemical mechanical polish (CMP) planarizing rates and chemical mechanical polish (CMP) planarizing uniformities are reported in Table I, along with corresponding data for a silicon oxide dielectric layer formed through a plasma enhanced chemical vapor deposition (PECVD) method otherwise conventional in the art of integrated circuit microelectronics fabrication.

TABLE I

| Dielectric Layer Composition | CMP Planarizing Rate (angstroms/min) | CMP Uniformity (percent) |
|---|---|---|
| first siloxane material | 50 | 15 |
| O2 plasma treated first material | 1500 | 5–8 |
| second siloxane material | 700 | 18 |
| O2 plasma treated second material | 2000 | 5–8 |
| PECVD oxide material | 1500 | 5 |

As is seen from review of the data presented within Table I, chemical mechanical polish (CMP) planarizing rates for dielectric layers formed from either the first organo-functional siloxane polymer dielectric material without oxygen plasma treatment or the second organo-functional siloxane polymer dielectric material without oxygen plasma treatment are substantially lower than the chemical mechanical polish (CMP) planarizing rate for a dielectric layer formed of a silicon oxide material deposited through a plasma enhanced chemical vapor deposition (PECVD) method. In contrast, chemical mechanical polish (CMP) planarizing rates for dielectric layers formed from oxygen plasma treatment of either the first organo-functional siloxane polymer dielectric material or the second organo-functional siloxane polymer dielectric material are at least equal to the chemical mechanical polish (CMP) planarizing rate of the dielectric layer formed of the silicon oxide material deposited through the plasma enhanced chemical vapor deposition (PECVD) method. As is also seen from review of the data in Table I, enhanced chemical mechanical polish (CMP) planarizing uniformity generally parallels increased chemical mechanical polish (CMP) planarizing rate. Thus, it is seen from the data of Table I that the method of the present invention provides both increased chemical mechanical polish (CMP) planarizing rate and enhanced chemical mechanical polish (CMP) planarizing uniformiity when forming a low dielectric constant dielectric layer within an integrated circuit microelectronics fabrication.

As is understood by a person skilled in the art, the preferred embodiment and examples of the present invention are illustrative of the present invention rather than limiting of the present invention. Revisions and modifications may be made to methods, materials, structures and dimensions through which is provided the preferred embodiment and examples of the present invention while still providing embodiments and examples which are within the spirit and scope of the present invention, as defined by the accompanying claims.

What is claimed is:

1. A chemical mechanical polish (CMP) planarizing method for forming a planarized organo-functional siloxane polymer dielectric layer within a microelectronics fabrication comprising:

providing a substrate employed within a microelectronics fabrication;

forming over the substrate an organo-functional siloxane polymer dielectric layer;

treating partially the organo-functional siloxane polymer dielectric layer with an oxygen containing plasma to form from the organo-functional siloxane polymer dielectric layer an oxygen containing plasma treated organo-functional siloxane polymer dielectric upper layer and an organo-functional siloxane polymer dielectric lower residue layer; and planarizing through a chemical mechanical polish (CMP) planarizing method the oxygen containing plasma treated organo-functional siloxane polymer dielectric upper layer to form a planarized oxygen containing plasma treated organo-functional siloxane polymer dielectric upper layer.

2. The method of claim 1 wherein the microelectronics fabrication is chosen from the group of microelectronics fabrications consisting of integrated circuit microelectronics fabrications, solar cell microelectronics fabrications, ceramic packaging microelectronics fabrications, other packaging microelectronics fabrications and flat panel display microelectronics fabrications.

3. The method of claim 1 wherein:

the organo-functional siloxane polymer dielectric layer is formed from an organo-functional siloxane polymer dielectric material having a dielectric constant of from about 1.8 to about 3.9;

the organo-functional siloxane polymer dielectric layer is from about 2000 to about 10000 angstroms thick;

the oxygen containing plasma treated organo-functional siloxane polymer dielectric upper layer is from about 1000 to about 9000 angstroms thick; and the organo-functional siloxane polymer dielectric lower residue layer is from about 1000 to about 9000 angstroms thick.

4. The method of claim 1 wherein the oxygen containing plasma employs an oxygen containing species chosen from the group of oxygen containing species consisting of oxygen, ozone, nitrous oxide and nitric oxide.

5. A chemical mechanical polish (CMP) planarizing method for forming a planarized organo-functional siloxane polymer dielectric layer upon a microelectronics structure within a microelectronics fabrication comprising:

provided a substrate employed within a microelectronics fabrication;

forming over the substrate a microelectronics structure;

forming over the substrate and upon the microelectronics structure an organo-functional siloxane polymer dielectric layer;

treating partially the organo-functional siloxane polymer dielectric layer with an oxygen containing plasma to form from the organo-functional siloxane polymer dielectric layer an oxygen containing plasma treated organo-functional siloxane polymer dielectric upper layer and an organo-functional siloxane polymer dielectric lower residue layer; and planarizing through a chemical mechanical polish (CMP) planarizing method the oxygen containing plasma treated organo-functional siloxane polymer dielectric upper layer to form a planarized oxygen containing plasma treated organo-functional siloxane polymer dielectric upper layer.

6. The method of claim 5 wherein the microelectronics fabrication is chosen from the group of microelectronics fabrications consisting of integrated circuit microelectronics fabrications, solar cell microelectronics fabrications, ceramic packaging microelectronics fabrications, other packaging microelectronics fabrications and flat panel display microelectronics fabrications.

7. The method of claim 5 wherein the microelectronics structure is chosen from the group of microelectronics structures consisting of microelectronics conductor structures, microelectronics semiconductor structures and microelectronics insulator structures.

8. The method of claim 5 wherein:

the organo-functional siloxane polymer dielectric layer is formed from an organo-functional siloxane polymer dielectric material having a dielectric constant of from about 1.8 to about 3.9;

the organo-functional siloxane polymer dielectric layer is from about 2000 to about 10000 angstroms thick;

the oxygen containing plasma treated organo-functional siloxane polymer dielectric upper layer is from about 1000 to about 9000 angstroms thick; and the organo-functional siloxane polymer dielectric lower residue layer is from about 1000 to about 9000 angstroms thick.

9. The method of claim 5 wherein the oxygen containing plasma employs an oxygen containing species chosen from the group of oxygen containing species consisting of oxygen, ozone, nitrous oxide and nitric oxide.

10. The method of claim 5 wherein the oxygen containing plasma treated organo-functional siloxane dielectric upper layer is formed to a thickness which reaches the microelectronics structure.

11. A chemical mechanical polish (CMP) planarizing method for forming a planarized organo-functional siloxane polymer dielectric layer upon a patterned conductor layer within an integrated circuit comprising:

providing a semiconductor substrate;

forming over the semiconductor substrate a patterned conductor layer;

forming over the semiconductor substrate and upon the patterned conductor layer an organo-functional siloxane polymer dielectric layer;

treating partially the organo-functional siloxane polymer dielectric layer with an oxygen containing plasma to form from the organo-functional siloxane polymer dielectric layer an oxygen containing plasma treated organo-functional siloxane polymer dielectric upper layer and an organo-functional siloxane polymer dielectric lower residue layer; and planarizing through a chemical mechanical polish (CMP) planarizing method the oxygen containing plasma treated organo-functional siloxane polymer dielectric upper layer to form a planarized oxygen containing plasma treated organo-functional siloxane polymer dielectric upper layer.

12. The method of claim 11 wherein:

the organo-functional siloxane polymer dielectric layer is formed from an organo-functional siloxane polymer dielectric material having a dielectric constant of from about 1.8 to about 3.9;

the organo-functional siloxane polymer dielectric layer is from about 2000 to about 10000 angstroms thick;

the oxygen containing plasma treated organo-functional siloxane polymer dielectric upper layer is from about 1000 to about 9000 angstroms thick; and the organo-functional siloxane polymer dielectric lower residue layer is from about 1000 to about 9000 angstroms thick.

13. The method of claim 11 wherein the oxygen containing plasma employs an oxygen containing species chosen from the group of oxygen containing species consisting of oxygen, ozone, nitrous oxide and nitric oxide.

14. The method of claim 11 wherein the oxygen containing plasma treated organo-functional siloxane dielectric upper layer is formed to a thickness which reaches the patterned conductor layer.

15. The method of claim 1 wherein by treating partially the organo-functional siloxane polymer dielectric layer with the oxygen containing plasma to form the oxygen containing plasma treated organo-functional siloxane polymer dielectric upper layer and the organo-functional siloxane polymer dielectric lower residue layer there is provided an enhanced chemical mechanical polish (CMP) planarizing rate and an enhanced chemical mechanical polish (CMP) planarizing uniformity of the of the organo-functional siloxane polymer dielectric layer.

16. The method of claim 6 wherein by treating partially the organo-functional siloxane polymer dielectric layer with the oxygen containing plasma to form the oxygen containing plasma treated organo-functional siloxane polymer dielectric upper layer and the organo-functional siloxane polymer dielectric lower residue layer there is provided an enhanced chemical mechanical polish (CMP) planarizing rate and an enhanced chemical mechanical polish (CMP) planarizing uniformity of the of the organo-functional siloxane polymer dielectric layer.

17. The method of claim 13 wherein by treating partially the organo-functional siloxane polymer dielectric layer with the oxygen containing plasma to form the oxygen containing plasma treated organo-functional siloxane polymer dielectric upper layer and the organo-functional siloxane polymer dielectric lower residue layer there is provided an enhanced chemical mechanical polish (CMP) planarizing rate and an enhanced chemical mechanical polish (CMD) planarizing uniformity of the of the organo-functional siloxane polymer dielectric layer.

* * * * *